United States Patent
Kim et al.

(10) Patent No.: US 9,543,021 B2
(45) Date of Patent: Jan. 10, 2017

(54) SEMICONDUCTOR DEVICE AND PROGRAMMING METHOD THEREOF

(71) Applicant: SK hynix Inc., Icheon-si Gyeonggi-do (KR)

(72) Inventors: Se Jun Kim, Suwon-si (KR); Jae Il Tak, Seoul (KR); Kyung Hwan Park, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 281 days.

(21) Appl. No.: 14/455,438

(22) Filed: Aug. 8, 2014

(65) Prior Publication Data
US 2015/0262678 A1    Sep. 17, 2015

(30) Foreign Application Priority Data

Mar. 12, 2014 (KR) .......... 10-2014-0029006
Jul. 2, 2014 (KR) .......... 10-2014-0082454

(51) Int. Cl.
*G11C 16/10* (2006.01)
*G11C 16/34* (2006.01)
*G11C 16/04* (2006.01)

(52) U.S. Cl.
CPC ........... *G11C 16/10* (2013.01); *G11C 16/0483* (2013.01); *G11C 16/3459* (2013.01)

(58) Field of Classification Search
CPC .. G11C 16/10; G11C 16/0483; G11C 16/3459
USPC ................................... 365/185.22
See application file for complete search history.

(56) References Cited

U.S. PATENT DOCUMENTS

| | | | | |
|---|---|---|---|---|
| 2006/0007742 A1* | 1/2006 | Yeh | ..................... | G11C 16/0483 365/185.18 |
| 2009/0103355 A1* | 4/2009 | Saitou | ................ | G11C 16/0425 365/184 |
| 2009/0303789 A1* | 12/2009 | Fernandes | ........... | G11C 11/5628 365/185.03 |
| 2010/0118606 A1* | 5/2010 | Lee | ..................... | G11C 11/5628 365/185.03 |
| 2013/0155771 A1* | 6/2013 | Kim | .................. | H01L 29/66833 365/185.05 |

FOREIGN PATENT DOCUMENTS

| | | | |
|---|---|---|---|
| KR | 1020010105143 A | | 11/2001 |
| KR | 1020090014531 A | | 2/2009 |
| KR | 101076880 B1 | | 10/2011 |

* cited by examiner

*Primary Examiner* — Hoai V Ho
*Assistant Examiner* — Muna A Techane
(74) *Attorney, Agent, or Firm* — William Park & Associates Ltd.

(57) ABSTRACT

A semiconductor device includes a plurality of electrically coupled memory cells in a generally vertical configuration extending in a generally perpendicular direction from a semiconductor substrate, a peripheral circuit configured to program the memory cells, and a control circuit configured to program a memory cell selected from the plurality of memory cells to trap charge in the selected memory cell, and to issue at least one command to the peripheral circuit to manage a dispersion of at least a portion of the trapped charge between memory cells adjacent to the selected memory cell.

20 Claims, 7 Drawing Sheets

SEMICONDUCTOR DEVICE AND PROGRAMMING METHOD THEREOF

CROSS-REFERENCE TO RELATED APPLICATIONS

The present application claims priority to Korean patent application numbers 10-2014-0029006 filed on Mar. 12, 2014 and 10-2014-0082454 filed on Jul. 2, 2014, in the Korean Intellectual Property Office, the entire disclosure of which is incorporated by reference herein.

BACKGROUND

1. Technical Field

The invention relates generally to a semiconductor device and a programming method thereof, and more particularly, to a semiconductor device having a three-dimensional (3D) structure and a programming method thereof.

2. Related Art

A semiconductor device typically includes a memory cell array configured to store data, a program associated with the memory cell array, a peripheral circuit configured to perform read and erase operations, and a control circuit for controlling the peripheral circuit.

Examples of semiconductor devices include, but are not limited to, two-dimensional (2D) semiconductor devices and three-dimensional (3D) semiconductor devices. In a 2D semiconductor device, the memory cells are arranged in a generally parallel configuration on a semiconductor substrate, In a 3D semiconductor device, the memory cells are arranged in a generally perpendicular configuration on a semiconductor substrate.

In a 3D semiconductor device, the memory cell array typically includes a plurality of memory blocks. Each of the memory blocks is includes a plurality of vertical strings arranged in a generally perpendicular configuration with respect to the semiconductor substrate. The vertical strings include a vertical channel film. The vertical channel film is surrounded by a tunnel insulating film. The tunnel insulating film is surrounded by a memory film. The memory film includes a charge storage film. The charge storage film extends vertically along the tunnel insulating film A plurality of of word lines are spaced apart from each other vertically along the charge storage film in a stacked configuration.

While a configuration of a 3D semiconductor device has been described above, the 3 semiconductor device may have alternative configurations. The other configurations also typically include the vertically extending charge storage film and vertically spaced apart word lines in a stacked configuration.

A programming operation of the 3D semiconductor device is typically performed in the manner described below.

When a programming voltage of a relatively higher voltage is applied to a selected word line, charge is trapped in a memory cell electrically coupled to the selected word line. Charge is typically trapped in a charge storage film where the selected word line is formed.

Since the charge storage film extends vertically, the trapped charge may be move to an upper portion or a lower portion due to a relative difference in the density of the charge trapped in the charge storage film.

SUMMARY

An embodiment of a semiconductor device includes a plurality of electrically coupled memory cells in a generally vertical configuration extending in a substantially perpendicular direction from a semiconductor substrate, a peripheral circuit configured to program the memory cells, and a control circuit configured to program a memory cell selected the plurality of memory cells to trap charge in the selected memory cell, and to issue at least one command to the peripheral circuit to manage a dispersion of at least a portion of the trapped charge between memory cells adjacent to the selected memory cell.

An embodiment of a programming method of a semiconductor device includes programming a selected memory cell so that charge is trapped in the selected memory cell, dispersing at least a portion of the charge trapped in the selected memory in a direction of the memory cells adjacent to the selected memory cell, and verifying the selected memory cell.

An embodiment of a programming method of a semiconductor device including programming a selected memory cell by applying a programming voltage to a selected word line electrically coupled to the selected memory cell so that charge is trapped in the selected memory cell, dispersing at least a portion of the charge trapped in the selected memory cell between memory cells adjacent to the selected memory cell by applying a first sub-voltage to adjacent word lines electrically coupled to the adjacent memory cells, verifying the selected memory cell by applying a verification voltage to the selected word line, and repeating the programming of the selected memory cell, the dispersing of at least a portion of the charge, and the verifying of the selected memory cell until the selected memory cell passes a verification operation associated with verifying the selected memory cell.

DETAILED DESCRIPTION

Various embodiments will be described with reference to the accompanying drawings.

Figure 1:
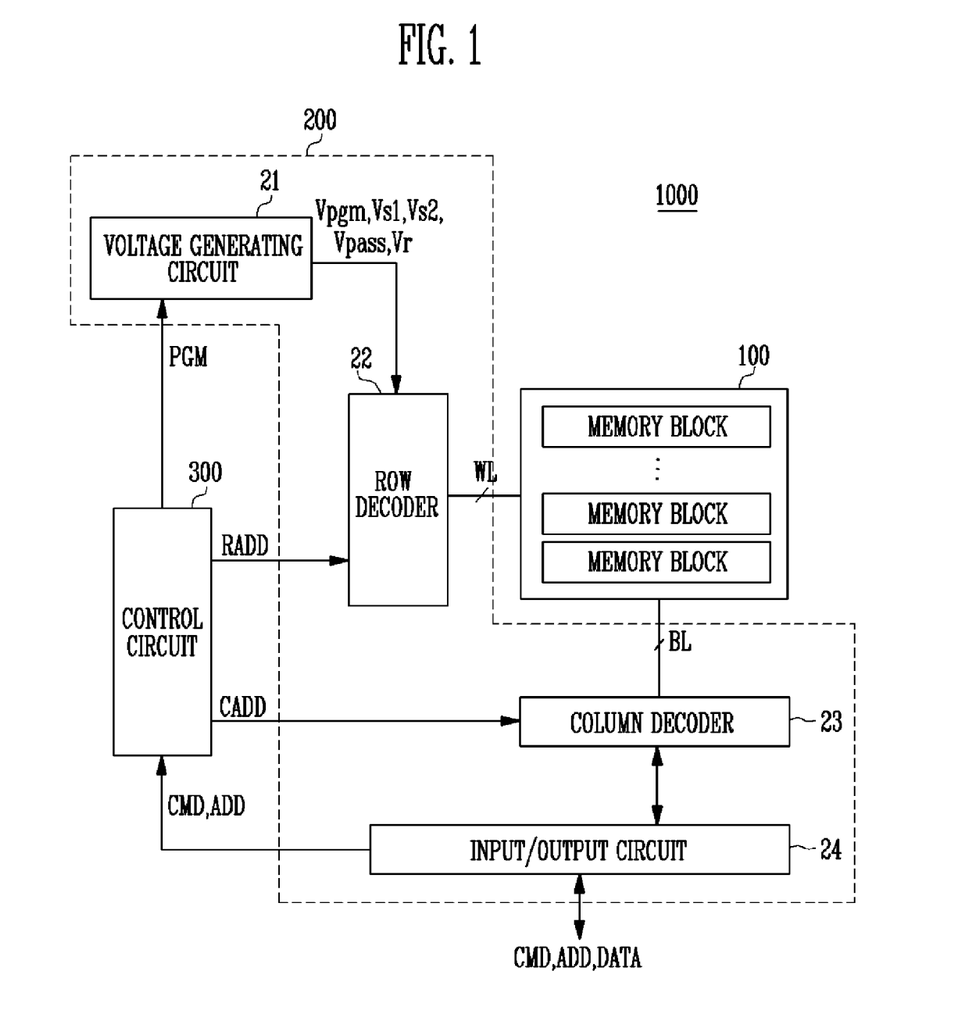
FIG. 1 is a block diagram representation of an embodiment of a semiconductor device.

FIG. 1 is a block diagram representation of an embodiment of a semiconductor device 1000.

The semiconductor device 1000 includes a memory cell array 100, a peripheral circuit 200 and a control circuit 300. The memory cell array 100 is configured to store data. The peripheral circuit 200 is configured to perform read and erase operations. The control circuit 300 is configured to control one or more operations of the the peripheral circuit 200.

The memory cell array 100 includes a plurality of memory blocks. The memory blocks are configured in a substantially similar manner. Each of the memory blocks a plurality of three-dimensional (3D) vertical strings.

The peripheral circuit 200 includes a voltage generating circuit 21, a row decoder 22, a column decoder 23, and an input/output circuit 24.

The voltage generating circuit 21 is configured to generate one or more voltages having voltage levels based on one or more operation signals. For example, the voltage generating circuit 21 is configured to generate a programming voltage (Vpgm), a first sub-voltage Vs1, a second sub-voltage Vs2, a pass voltage Vpass, and a verification voltage Vr in response to one or more program operation signals PGM received from the control circuit 300. The programming voltage Vpgm is applied to a selected word line to increase a threshold voltage of a selected memory cell. The first sub-voltage Vs1 and the second sub-voltage Vs2 are applied to a selected word line and to the word lines adjacent to the selected word line to disperse a portion of the charge trapped in the selected memory cell. The pass voltage Vpass is applied to unselected word lines. The verification voltage Vr is applied to the selected word line when a program verification operation is performed.

The row decoder 22 is configured to select a memory block from the plurality of memory blocks, and to transmit the voltages generated by the voltage generating circuit 21 to the word lines that are electrically coupled to the selected memory block.

The column decoder 23 is configured to transmit and receive data via bit lines BL in response to a column address signal CADD.

The input/output circuit 24 is configured to receive one or more command signals CMD, an address signal ADD, and data signals DATA and to transmit the received command signals CMD and address signal ADD to the control circuit 300. The input/output circuit 24 is configured to transmit the data signal DATA to the column decoder 23 or to transmit a data signal DATA received from the column decoder 23 to an external device.

The control circuit 300 is configured to transmit one or more programming operation signals PGM for controlling one or more operations of the peripheral circuit 200, a row address signal RADD, and a column address signal CADD in response to the command signals CMD and the address signal ADD. The control circuit 300 applies the programming voltage to the selected word line when the programming operation is performed to trap charge in the selected memory cells. The control circuit 300 controls one or more operations of the peripheral circuit 200 that facilitate the dispersion of a portion of the charge trapped in the selected memory cells prior to the performance of a program verification operation of the selected memory cells.

Figure 2:
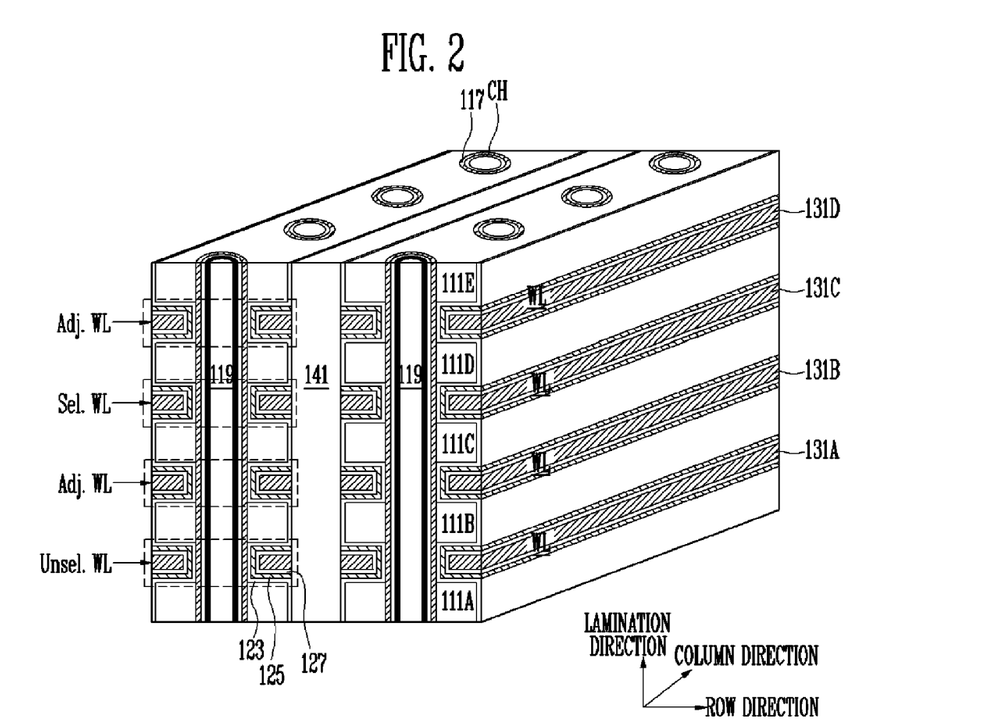
FIG. 2 is a perspective view of a memory block of an embodiment of a three-dimensional (3D) semiconductor device.

FIG. 2 is a perspective view of a memory block of an embodiment of a three-dimensional (3D) semiconductor device.

The memory block is formed on a semiconductor substrate, and includes a plurality of vertical channel films CH arranged in the form of a matrix. The matrix includes a plurality of columns and rows. Each vertical channel film CH may have a generally tube shaped configuration and is filled with an insulating film 119 or may be formed as a column made of a semiconductor material film at a surface and the center portion thereof.

Each vertical channel film CH is surrounded by a memory film 117. The memory film 117 includes a tunnel insulating film that surrounds the vertical channel film CH and a charge storage film that surrounds the tunnel insulating film. The vertical channel film CH may be a polysilicon film. The tunnel insulating film may be an oxide film. The charge storage film may be a nitride film.

The vertical channel film CH may have an outer wall surface surrounded by the memory film 117. The memory film 117 may be surrounded by interlayer insulating films 111A-111E having an alternately laminated multilayered structure. The multilayered interlayer insulating films 111A-111E may be separated by an insulating film 141 formed in a slit shaped region between adjacent vertical channel films CH of two columns.

A recessed region is defined as a region between adjacent interlayer insulating films 111A-111E. Word lines WL are formed in the recessed region. A blocking insulating film 123 is formed along the surfaces of the recessed region and the interlayer insulating films 111A-111E. The blocking insulating film 123 may block charge movement. A diffusion prevention film 125 forms a laminating layer within the recessed region on the surface of the block insulating film 123. A barrier metal film 127 is formed as a layer on the surface of the diffusion prevention layer 125. Conductive films 131A-131D fill the recessed region defined by the barrier metal film 127. The conductive films 131A-131D are separated by the insulating film 141. The diffusion prevention film 125, the barrier metal film 127, and the conductive films 131A-131D formed on the blocking insulating film 123 constitute the word line WL that surrounds the vertical channel film CH. The multilayered word lines WL are separated from each other by the interlayer insulating films 111A-111E.

The memory cells are defined in the regions where the word line WL and the vertical channel film CH cross. For example, the memory film 117 formed between the word line WL and the vertical channel film CH, the blocking insulating film 123, the diffusion prevention film 125, and the barrier metal film 127 are defined as the memory cells. The memory film 117 extends in a generally vertical direction along the vertical channel film CH. The memory film 117 in the region where the word line WL and the vertical channel film CH cross is included in the memory cell.

The word line WL electrically coupled to the memory cells to be programmed (shown in FIG. 2) is defined as a selected word line Sel. WL. The word line adjacent an upper portion of the selected word line Sel. WL and the word line adjacent a lower portion of the selected word line Sel. WL are defined as adjacent word lines Adj. WL. The remaining word lines are defined as unselected word lines Unsel. WL. Programming operations of the semiconductor device described above are described below.

Figure 3:
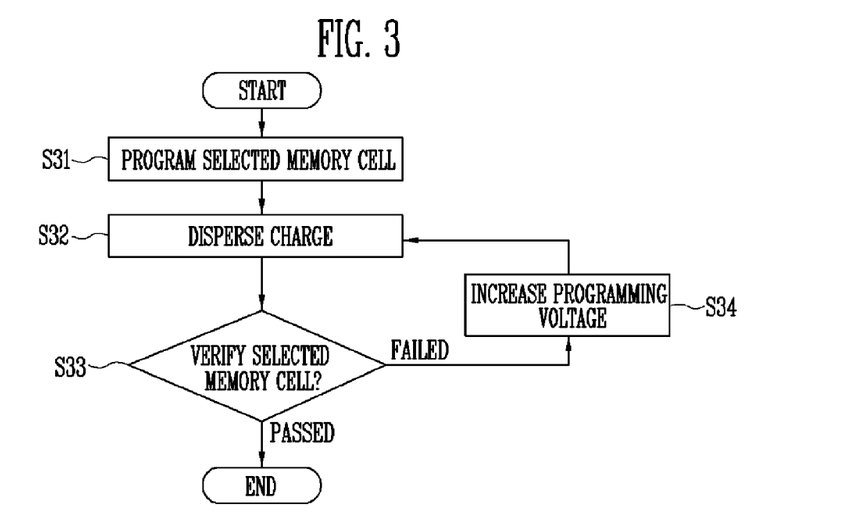
FIG. 3 is a flowchart representation of an example of a programming method of an embodiment of a semiconductor device.

FIG. 3 is a flowchart representation of an example of a programming method of an embodiment of a semiconductor device.

The programming operation may be performed using an Incremental Step Pulse Program ISPP method where a programming voltage is increased in a stepwise manner. The programming operation of the semiconductor device starts at operation S31. A programming voltage is applied to the selected word line Sel. WL of FIG. 2 electrically coupled to the selected memory cells to increase a threshold voltage of the selected memory cells. When the programming voltage is applied to the selected word line (Sel. WL, charge is trapped in the charge storage film of the selected memory cells. The trapped charge increases the threshold voltage of the selected memory cells.

In operation S32, the programming voltage is applied to the selected word line Sel. WL for a predetermined period of time, and a portion of the charge trapped in the selected memory cells is dispersed. More specifically, the portion of the charge trapped in the charge storage film in a region corresponding to the selected memory cells is dispersed along the charge storage film extending upward and downward from the selected memory cells, or the portion of the charge trapped in the selected memory cells is dispersed along the charge storage film extending in a direction of memory cells whose programming operations have been completely programmed, among memory cells adjacent to the selected memory cells. A first sub-voltage is applied to the adjacent word lines Adj. WL of FIG. 2 disposed adjacent to the upper portion of the selected word line Sel. WL and adjacent to the lower portion of the selected word line Sel. WL. When a portion of the charge in the selected memory cells is dispersed, the threshold voltages of the selected memory cells may be reduced to a relatively lower level. When a portion of the charge is dispersed between the memory cells adjacent to the selected memory cells in the same string, it may prevent the threshold voltages of the selected memory cells from being reduced to a relatively lower level after the programming operation is completed. The relatively lower threshold voltages may be increased by performing the next program loop.

The first sub-voltage applied to the adjacent word lines Adj. WL is set to reduce or minimize the movement of the portion of the charge dispersed from the selected memory cells to the adjacent memory cells. The first sub-voltage is set so that the portion of the charge is dispersed within the charge storage film extending between the memory cells adjacent to the selected memory cells.

When the programming operations of the selected memory cells are performed, a portion of the charge is dispersed to the memory cells adjacent to the selected memory cells within the string including the selected memory cells. The movement of the charge trapped in the selected memory cells towards the adjacent memory cells after the programming operation is completed may be reduced or minimized.

In operation S33, a sub-voltage is applied to the adjacent word lines Adj. WL for a predetermined period of time, and a verification operation is performed to determine whether the threshold voltages of each of the selected memory cells has reached a target level. If the threshold voltages of all of the selected memory cells are at the target level, the selected memory cells pass the verification operation and the programming operation of the selected memory cells electrically coupled to the selected word line (Sel. WL) is complete. When the programming operation of the selected memory cells is complete, the next word line is selected. If there is at least one selected memory cell with a threshold voltage that is less than the target level, the verification operation fails.

If the verification operation fails, the programming voltage is increased up to a step voltage in operation S34, and the above-described operations S31-S34 are repeated until the selected memory cells pass the verification operation.

Figure 4:
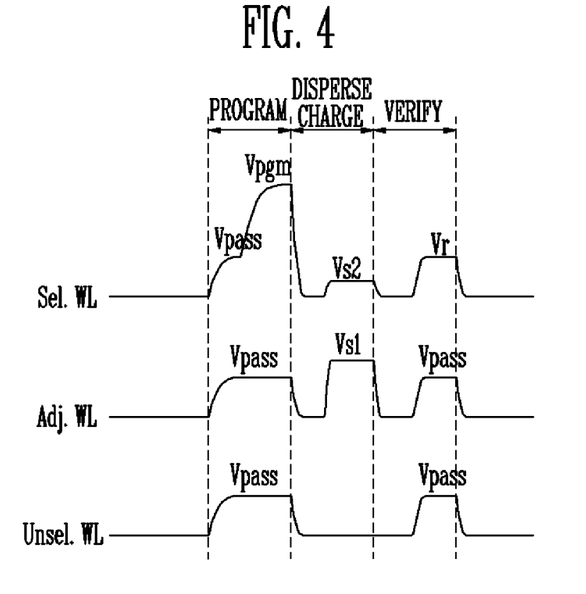
FIG. 4 is an example of a timing diagram of an embodiment of a programming method of an embodiment of a semiconductor device.

FIG. 4 is an example of a timing diagram of an embodiment of a programming method of an embodiment of a semiconductor device.

In an implementation of the ISPP method a program loop is repeatedly performed with the programming voltage being incrementally increased in a stepwise manner until the selected memory cells pass the verification operation. An example of a single program loop is described with reference to FIG. 4. The program loop includes a programming section, a charge dispersion section, and a verification section.

When the programming section initiated, the control circuit 300 of FIG. 1 issues one or more commands to the peripheral circuit 200 of FIG. 1 to apply a pass voltage Vpass to the word lines Sel. WL, Adj. WL, Unsel. WL that are electrically coupled to the selected memory block. The selected memory cells, the memory cells to be programmed, are electrically coupled to the selected word line Sel. WL. The adjacent word lines 'Adj. WL' are the word lines that are adjacent to the selected word line Sel. WL. A first adjacent word line Adj. WL is adjacent to the upper portion of the selected word line Sel. WL and a second adjacent word line Adj. WL is adjacent to the lower portion of the selected word line Sel. WL. The remaining word linea are unselected word lines Unsel. WL.

The pass voltage Vpass is applied for a predetermined period of time. Then the control circuit 300 issues one or more commands to the peripheral circuit 200 to apply the programming voltage Vpgm to the selected word line Sel. WL to increase the threshold voltages of the selected memory cells. When a programming voltage Vpgm having a relatively higher voltage is applied to the selected word line Sel. WL, negative charge is trapped in the selected memory cells and the threshold voltages of the selected memory cells are increased.

The programming voltage Vpgm is applied to the selected word line Sel. WL for a predetermined period of time, and then the charge dispersion section is initiated.

When the charge dispersion section is initiated, the control circuit 300 issues to one or more commands that cause the word lines Sel. WL, Adj. WL, Unsel. WL to be discharged. The control circuit 300 then issues one or more commands to the peripheral circuit 200. Responsive to the one or more commands received from the control circuit 300, the peripheral circuit 200 applies the first sub-voltage Vs1 to the word lines Adj. WL adjacent to the selected word line Sel. WL so that a portion of the negative charge trapped in the selected memory cells is dispersed through the charge storage film extending within the same string. When the first sub-voltage Vs1 is applied to the adjacent word lines Adj. WL, the portion of the charge trapped in the charge storage film of the selected memory cells moves to the charge storage film where the charge storage film extends in the direction of the adjacent word lines Adj. WL. The level of the first sub-voltage Vs1 and the application time of the first sub-voltage Vs1 may be set to reduce or to minimize the movement of the dispersed charge to the charge storage film of the memory cells adjacent to the selected memory cells.

When the first sub-voltage Vs1 is applied to the adjacent word lines Adj. WL to reduce or minimize the dispersion of the charge trapped in the selected memory cells, a second sub-voltage Vs2 may be applied to the selected word line Sel. WL. The second sub-voltage Vs2 is set to be relatively lower than the first sub-voltage Vs1.

The second sub-voltage Vs2 may be set to have a level that is approximately 4 V to approximately 6 V lower than the level of the first sub-voltage Vs1. The first sub-voltage Vs1 may be set to a level in a range from approximately 0 V to approximately 12 V. The second sub-voltage Vs2 may be set in a range from approximately −4 V to approximately 8 V. For example, when a first sub-voltage Vs1 of approximately 12 V is applied to the adjacent word lines Adj. WL, a second sub-voltage Vs2 of approximately 8 V is applied to the selected word line Sel. WL. In another example, when a first sub-voltage Vs1 of approximately 0 V is applied to the adjacent word lines Adj. WL, a second sub-voltage Vs2 of approximately −4 V is applied to the selected word line Sel. WL to disperse a portion of the charge trapped in the selected memory cells. A voltage difference between the word lines Adj. WL adjacent to the selected word line Sel. WL is generated to cause a dispersion of a portion of the charge trapped in the selected memory cells.

The charge trapped in the selected memory cells is dispersed for a predetermined period of time, and then the verification section of the selected memory cells is initiated.

When the verification section is initiated, the control circuit 300 issues one or more commands to enable the word lines Sel. WL, Adj. WL, and Unsel. WL to be discharged, and then issues one or more commands to enable the pass voltage Vpass to be applied to the adjacent word lines Adj. WL and the unselected word lines Unsel. WL and to enable the verification voltage Vr to be applied to the selected word line Sel. WL. The control circuit 300 then issues one or more commands to the peripheral circuit 200 to determine whether the threshold voltages of each of the selected memory cells have reached the target level. When the threshold voltages of the selected memory cells reach the target level, the selected memory cells pass the verification operation. When one or more of the selected memory cells fail to reach the target level, the verification operation is fails.

If the selected memory cells pass the verification operation, the control circuit 300 completes the programming operation of the selected memory cells, and then issues one or more commands to the peripheral circuit 200 to perform a programming operation of the selected memory cells that are electrically coupled to the next word line. If the selected memory cells fail the verification operation, the control circuit 300 issues one or more commands to the peripheral circuit 200 to incrementally increase the programming voltage (Vpgm) in a stepwise manner and repeat the program loop until the selected memory cells pass the verification operation.

As described above, by dispersing a portion of the charge through the charge storage film of the selected memory cells while the programming operation of the selected memory cells is performed, it is possible to reduce or minimize the movement of the charge trapped in the memory cells whose programming operations have been completed through the charge storage film. By reducing or minimizing the movement of the charge of the selected memory cells, it may be possible to reduce or minimize changes in the threshold voltages of the memory cells whose programming operations have been completed. This may result in improvements in the retention characteristics of the semiconductor device.

Since the 3D semiconductor device can have various different string structures, a programming operation in accordance with a number of different string structures will be described.

Figure 5:
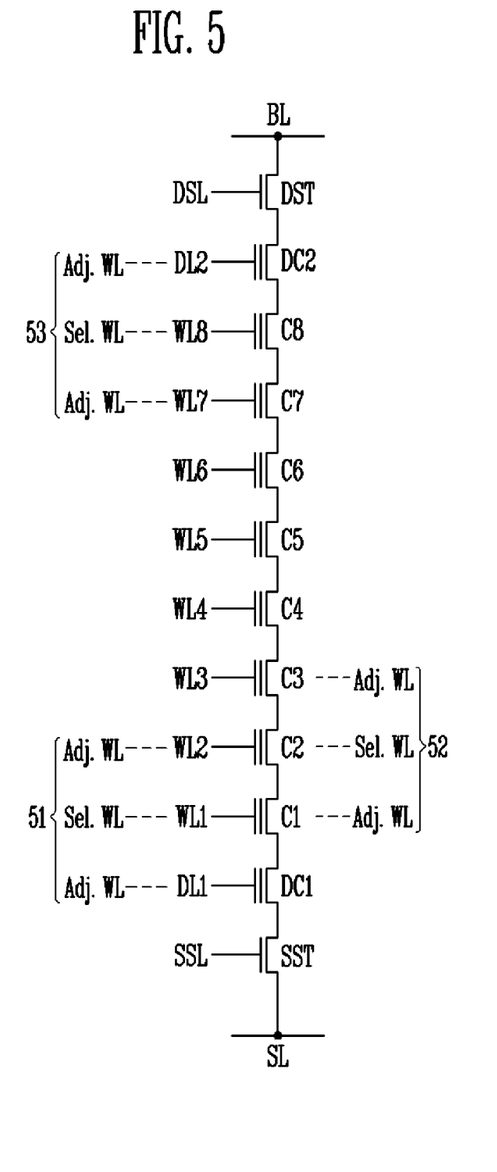
FIG. 5 is a circuit diagram representation of a string of an embodiment of a semiconductor device.

FIG. 5 is a circuit diagram representation of a string of an embodiment of a semiconductor device.

The string of the semiconductor device may be formed to have a generally "I"-shape in a generally perpendicular configuration with respect to the semiconductor substrate. For example, a source line SL is electrically coupled to a lower portion of the string, and a bit line BL is electrically coupled to an upper portion of the string. The string includes source selection transistors SST electrically coupled in series with a first dummy cell DC1, a plurality of of memory cells C1-C8, a second dummy cell DC2, and drain selection transistors DST between the source line SL and the bit line BL. A gate of the source selection transistor SST is electrically coupled to a source selection line SSL. A gate of the first dummy cell DC1 is electrically coupled to a first dummy line DL1. The gates of the first to eighth memory cells C1-C8 are electrically coupled to first to eighth word lines WL1-WL8, respectively. A gate of the second dummy cell DC2 is electrically coupled to a second dummy line DL2. A gate of the drain selection transistor DST is electrically coupled to a drain selection line DSL. While eight memory cells C1-C8 and two dummy cells DC1, DC2 are shown in FIG. 5, a larger number of memory cells and dummy cells may be included in the semiconductor device.

The first and second dummy cells DC1, DC2 are not used to store actual data. The first and second dummy cells DC1, DC2 perform a function of complementing operations of the semiconductor device. Examples of such operations include program, read and erase operations. In order to describe a programming method of the memory cells that are electrically coupled to different regions, programming operations of the first memory cell C1, the second memory cell C2, and the eighth memory cell C8 are described as examples.

Programming Operation of the First Memory Cell (51)

During the programming operation of the first memory cell C1, the first word line WL1 electrically coupled to the first memory cell C1 is the selected word line (Sel. WL). The first dummy line DL1 adjacent to a lower portion of the first word line WL1 and the second word line WL2 adjacent to an upper portion of the first word line WL1 are the adjacent word lines Adj. WL. The remaining third through eighth word lines WL3-WL8 and the second dummy line DL2 are the unselected word lines Unsel. WL. When the programming operation of the first memory cell C1 is performed, the first sub-voltage Vs1 is applied to the first dummy line DL1 and to the second word line WL2, and the second sub-voltage Vs2 is applied to the first word line WL1 during the performance of the charge dispersion section.

Programming Operation of the Second Memory Cell (52)

During the programming operation of the second memory cell C2, the second word line WL2 electrically coupled to the second memory cell C2 is the selected word line Sel. WL. The first word line WL1 adjacent to a lower portion of the second word line WL2 and the third word line WL3 adjacent to an upper portion of the second word line WL2 are the adjacent word lines Adj. WL. The first dummy line DL1, the fourth through eighth word lines WL4-WL8, and the second dummy line DL2 are the unselected word lines Unsel. WL. When the programming operation of the second memory cell C2 is performed, the first sub-voltage Vs1 is applied to the first word line WL1 and to the third word line WL3, and the second sub-voltage Vs2 is applied to the second word line WL2 during the performance of the charge dispersion section.

Programming Operation of the Eighth Memory Cell (53)

During the programming operation of the eighth memory cell C8, the eighth word line WL8 electrically coupled to the eighth memory cell C8 is the selected word line Sel. WL. The seventh word line WL7 adjacent to a lower portion of the eighth word line WL8 and the second dummy line DL2 adjacent to an upper portion of the eighth word line WL8 are the adjacent word lines Adj. WL. The first dummy line DL1 and the first through sixth word lines WL1-WL6 are the unselected word lines Unsel. WL. When the programming operation of the eighth memory cell C8 is performed, the first sub-voltage Vs1 is applied to the seventh word line WL7 and to the second dummy line DL2 and the second sub-voltage Vs2 is applied to the eighth word line WL8 during the performance of the charge dispersion section.

During the charge dispersion section of the above-described programming operation, the first sub-voltage Vs1 is applied to the adjacent word lines Adj. WL disposed adjacent to the upper and lower portions of the selected word line Sel. WL. However, the first sub-voltage Vs1 may be applied to a word line coupled to memory cells whose programming operations have been completed, among the memory cells adjacent to the selected word line Sel. WL. On the assumption that a programming operation is performed in a direction from the source selection line SSL to the drain selection line DSL, a programming operation of the second memory cell C2 is described below as an example.

Since the programming operation of a page including the first memory cell C1 is completed before the second memory cell C2 is programmed, the first sub-voltage Vs1 is applied to the first word line WL1 coupled to the first memory cell C1 adjacent in the direction of the source select line SSL from the second memory cell C2, and the dummy line DL1, the third to eighth word lines WL3 to WL8, and the second dummy line DL2 are discharged.

Figure 6:
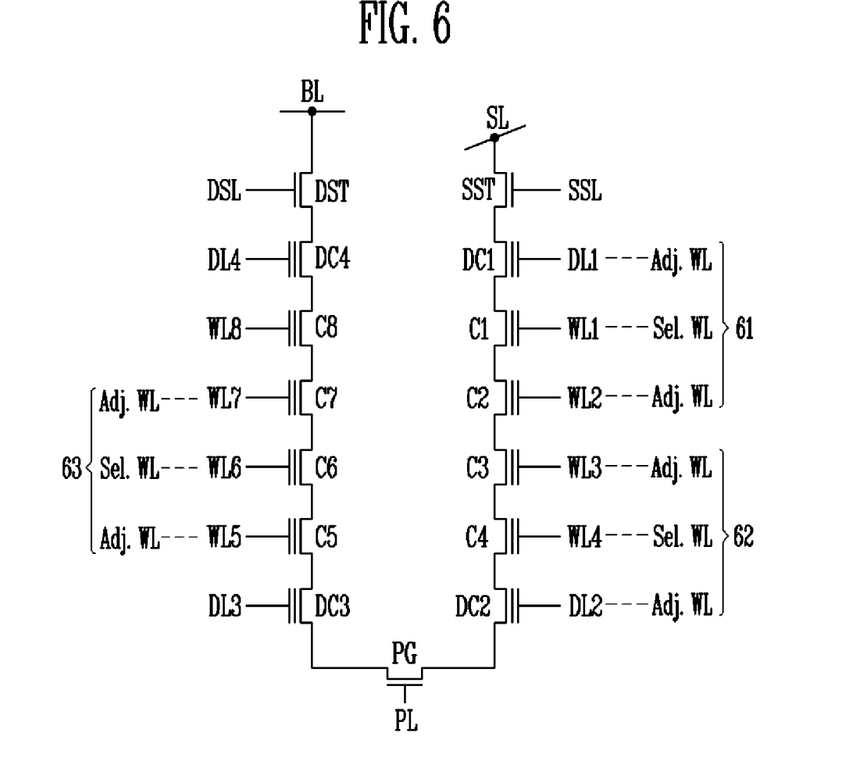
FIG. 6 is a circuit diagram representation of an embodiment of a string of a semiconductor device.

FIG. 6 is a circuit diagram representation of a string of an embodiment of a semiconductor device.

The string of the semiconductor device may be formed to have a generally "U"-shape in a generally perpendicular configuration with respect to the semiconductor substrate. For example, a first vertical string is formed between a source line SL and a pipe gate PG, and a second vertical string is formed between a bit line BL and the pipe gate PG. The first and second vertical strings are electrically coupled through the pipe gate PG such that the "U"-shaped strings forming a single pair. The pipe gate PG is electrically coupled to the lower portions of the first and second strings. The source line SL is electrically coupled to an upper portion of the first string, and the bit line BL is electrically coupled to an upper portion of the second string. The first string includes source selection transistors (SST) electrically coupled in series with a first dummy cell DC1, a plurality memory cells C1-C4, and a second dummy cell DC2 between the source line SL and the pipe gate PG. The second string includes a third dummy cell DC3 electrically coupled in series with a plurality of memory cells C5-C8, a fourth dummy cell DC4, and a drain selection transistor (DST) between the pipe gate PG and the bit line BL. A gate of the source selection transistor SST is electrically coupled to a source selection line SSL. A gate of the first dummy cell DC1 is electrically coupled to a first dummy line DL1. The gates of the first through fourth memory cells C1-C4 are electrically coupled to first through fourth word lines WL1-WL4, respectively. A gate of the second dummy cell DC2 is electrically coupled to a second dummy line DL2. A gate of the third dummy cell DC3 is electrically coupled to a third dummy line DL3. The gates of the fifth through eighth memory cells C5-C8 are electrically coupled to fifth through eighth word lines WL5-WL8, respectively. A gate of the fourth dummy cell DC4 is electrically coupled to a fourth dummy line DL4. A gate of the drain selection transistor DST is electrically coupled to a drain selection line DSL. While eight memory cells C1-C8 and four dummy cells DC1-DC4 are shown in FIG. 6, a larger number of memory cells and dummy cells may be included in the semiconductor device. The first through fourth dummy cells DC1-DC4 are not used to store actual data. The first through fourth dummy cells DC1-DC4 perform a function of complementing operations of the semiconductor device. Examples of such operations are program, read, and erase operations. In order to describe the programming method of memory cells that are electrically coupled to different regions, programming operations of the first memory cell C1, the fourth memory cell C4, and the sixth memory cell C6 will be described as examples.

Programming Operation of the First Memory Cell (61)

During the programming operation of the first memory cell C1, the first word line WL1 electrically coupled to the first memory cell C1 is the selected word line Sel. WL. The first dummy line DL1 adjacent to an upper portion of the first word line WL1 and the second word line WL2 adjacent to a lower portion of the first word line WL1 are the adjacent word lines Adj. WL. The remaining third through eighth word lines WL3-WL8 and the second through fourth dummy lines DL2-DL4 are the unselected word lines Unsel. WL. When the programming operation of the first memory cell C1 is performed, the first sub-voltage Vs1 is applied to the first dummy line DL1 and to the second word line WL2 and the second sub-voltage Vs2 is applied to the first word line WL1 during the performance of the charge dispersion section.

Programming Operation of the Fourth Memory Cell (62)

During the programming operation of the fourth memory cell C4, the fourth word line WL4 electrically coupled to the fourth memory cell C4 is the selected word line Sel. WL. The third word line WL3 adjacent to an upper portion of the fourth word line WL4 and the second dummy line DL1 adjacent to a lower portion of the fourth word line WL4 are the adjacent word lines Adj. WL. The first dummy line DL1, the first, second, and fifth through eighth word lines WL1, WL2, WL5-WL8, and the third and fourth dummy lines DL3, DL4 are the unselected word lines Unsel. WL. When the programming operation of the fourth memory cell C4 is performed, the first sub-voltage Vs1 is applied to the third word line WL3 and to the second dummy line DL2 and the second sub-voltage Vs2 is applied to the fourth word line WL4 during the performance of the charge dispersion section.

Programming Operation of the Sixth Memory Cell (63)

During the programming operation of the sixth memory cell C6, the sixth word line WL6 electrically coupled to the sixth memory cell C6 is the selected word line (Sel. WL). The fifth word line WL5 adjacent to a lower portion of the sixth word line WL6 and the seventh word line WL7 adjacent to an upper portion of the sixth word line WL6 are the adjacent word lines Adj. WL. The first through fourth dummy lines DL1-DL4, the first through fourth word lines WL1-WL4, and the eighth word line WL8 are the unselected word lines Unsel. WL. When the programming operation of the sixth memory cell C6 is performed, the first sub-voltage Vs1 is applied to the fifth word line WL5 and to the seventh word line WL7 and the second sub-voltage Vs2 is applied to the sixth word line WL6 during the performance of the charge dispersion section.

During the charge dispersion section of the above-described programming operation, the first sub-voltage Vs1 is applied to the adjacent word lines Adj. WL disposed adjacent to the upper and lower portions of the selected word line Sel. WL. However, the first sub-voltage Vs1 may be applied to a word line coupled to memory cells whose programming operations have been completed, among the memory cells adjacent to the selected word line Sel. WL. On the assumption that a programming operation is performed in a direction from the source selection line SSL to the drain selection line DSL, a programming operation of the fourth memory cell C4 is described below as an example.

Since the programming operation of a page including the third memory cell C3 is completed before the fourth memory cell C4 is programmed, the first sub-voltage Vs1 is applied to the third word line WL3 coupled to the third memory cell C3 adjacent in the direction of the source select line SSL from the fourth memory cell C4, and the dummy line DL1, the first and second word lines WL1 to WL2, the second and third dummy lines DL2 and DL3, the fifth to eighth word lines WL5 to WL8, and the fourth dummy line DL4 are discharged.

Figure 7:
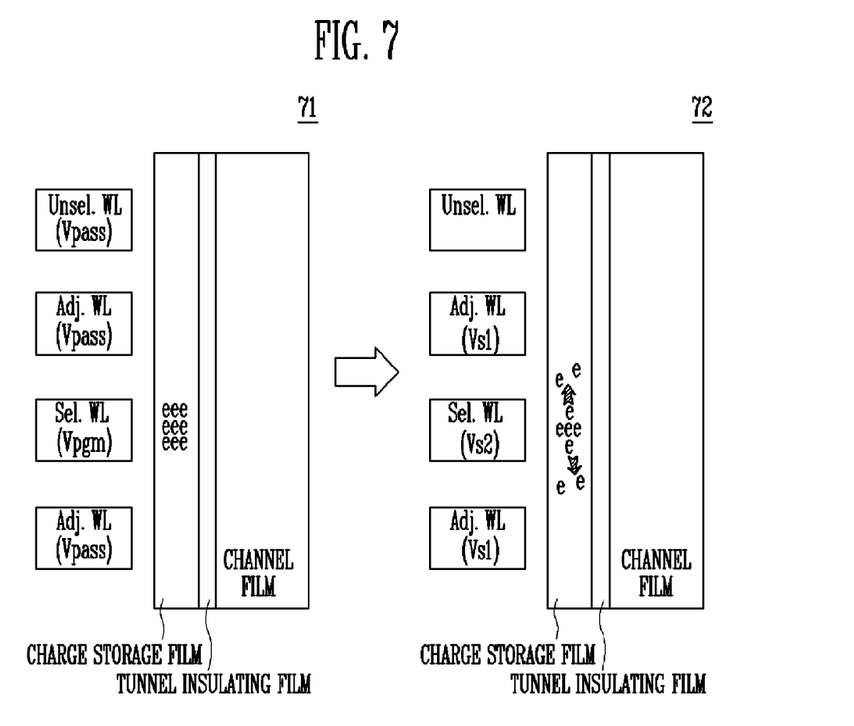
FIG. 7 is a cross-sectional view illustrating movement of charge in an embodiment of a programming method.

FIG. 7 is a cross-sectional view illustrating movement of charge according to an embodiment of a programming method.

A vertical string having a 3D structure includes a tunnel insulating film that surrounds a vertical channel film and a charge storage film that surrounds the tunnel insulating film. The word lines WL are laminated in a vertical direction along the charge storage film.

In order to program the selected memory cell, a programming voltage Vpgm is applied to the selected word line Sel. WL in a section 71, and charge (e) is trapped in the charge storage film of the selected memory cell. The charge (e) trapped in the charge storage film is negative charge.

The first sub-voltage Vs1 is applied to word lines Adj. WL adjacent to the selected word line Sel. WL The second sub-voltage Vs2 is relatively lower than the first sub-voltage Vs1. The second sub-voltage is applied to the selected word line Sel. WL in a section 72. A portion of the charge (e) trapped in the charge storage film of the memory cell electrically coupled to the selected word line Sel. WL is dispersed through the charge storage film.

When the portion of the charge (e) trapped in the charge storage film of the selected memory cell is dispersed to the charge storage film extending to the upper portion or the lower portion with respect to the selected memory cell, the movement of the charge (e) trapped in the selected memory cell may be reduced or minimized due to a repulsive force between the charge (e) trapped in the selected memory cell and the dispersed charge (e). Thus, retention characteristics of the semiconductor device may be improved.

Figure 8:
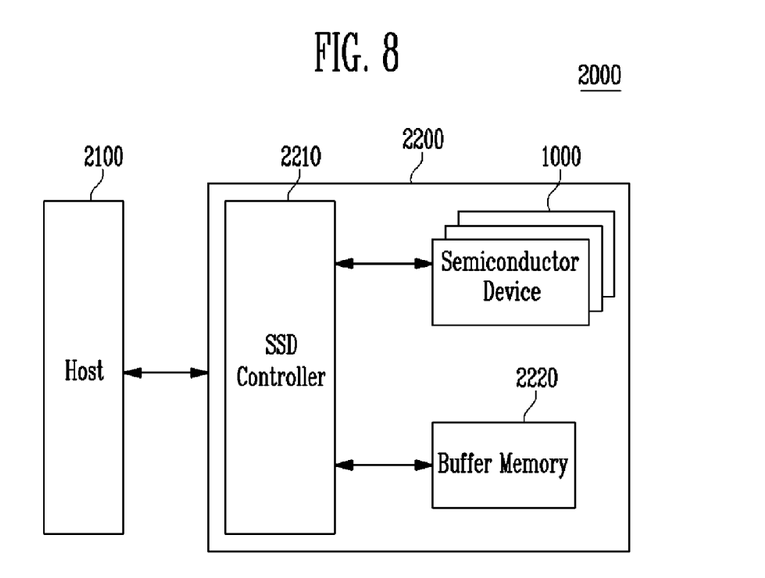
FIG. 8 is a block diagram representation of a solid state drive including an embodiment of a semiconductor device.

FIG. 8 is a block diagram representation of a solid state drive including an embodiment of a semiconductor device.

A drive device 2000 includes a host 2100 and an SSD 2200. The SSD 2200 includes an SSD controller 2210, a buffer memory 2220, and a semiconductor device 1000.

The SSD controller 2210 provides electrical coupling between the host 2100 and the SSD 2200. The SSD controller 2210 provides the SSD 2200 with an interface to the host and receives commands in a bus format from the host 2100. The SSD controller 2210 decodes commands received from the host 2100. The SSD controller 2210 accesses the semiconductor device 1000 in accordance with the decoded result. Examples of the bus format include, but are not limited to, Universal Serial Bus (USB), Small Computer System Interface (SCSI), PCI express, ATA, Parallel ATA (PATA), Serial ATA (SATA), and Serial Attached SCSI (SAS).

Program data received from the host 2100 and data read from the semiconductor device 1000 is temporarily stored in the buffer memory 2220. When data in the semiconductor device 1000 is cached in response to a read request from the host 2100, the buffer memory 2220 supports a cache function of providing the cached data directly to the host 2100. Typically a data transmission rate in the bus format (for example, SATA or SAS) of the host 2100 is relatively faster than a transmission rate of a memory channel of the SSD 2200. When the interface speed of the host 2100 is relatively faster than the transmission rate of the memory channel of the SSD 2200, performance degradation caused by differences in transmission rates may be reduced or minimized by providing a large capacity buffer memory 2220. The buffer memory 2220 may be a synchronous DRAM that provides buffering in a SSD 2200 used as a large capacity auxiliary memory device.

The semiconductor device 1000 is provided as a storage medium of the SSD 2200. For example, the semiconductor device 1000 may be a nonvolatile memory device having a relatively large storage capacity as described in FIG. 1. The semiconductor device 1000 may be a NAND-type flash memory device.

Figure 9:
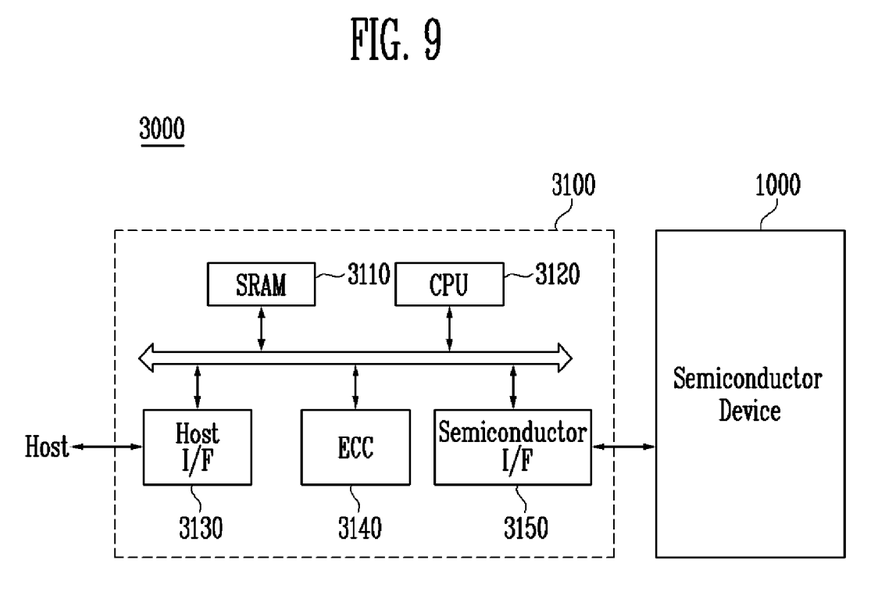
FIG. 9 is a block diagram representation of a memory system including an embodiment of a semiconductor device.

FIG. 9 is a block diagram representation of a memory system including an embodiment of a semiconductor device.

A memory system 3000 may include a memory control unit 3100 and a semiconductor device 1000.

The semiconductor device 1000 may be configured in substantially the same manner as the semiconductor device of 1000 in FIG. 1.

The memory control unit 3100 may be configured to control one or more operations of the semiconductor device 1000. An SRAM 3110 may be used as a working memory of a CPU 3120. A host interface (I/F) 3130 may include a data exchange protocol of a host electrically coupled with the memory system 3000. An error correction circuit (ECC) 3140 in the memory control unit 3100 may detect and correct an error in data read from the semiconductor device 1000. A semiconductor I/F 3150 may interface with the semiconductor device 1000. The CPU 3120 may perform a control operation for data exchange of the memory control unit 3100. In addition, a ROM (not shown) for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 10:
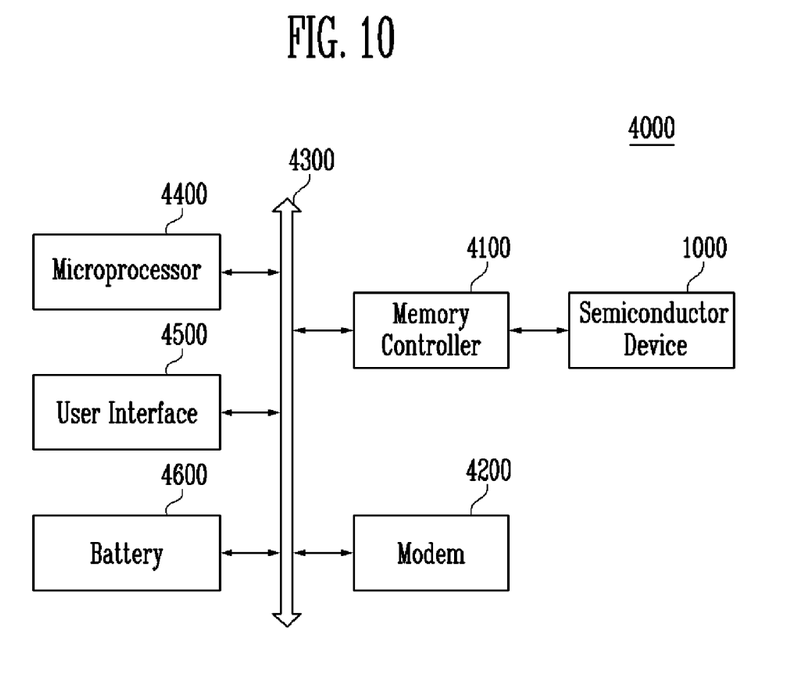
FIG. 10 is a schematic diagram representation of a configuration of a computing system including an embodiment of a semiconductor device.

FIG. 10 is a block diagram representation of a computing system including an embodiment of a semiconductor device.

The computing system 4000 includes an embodiment of a semiconductor device 1000 electrically coupled to a bus 4300, a memory controller 4100, a modem 4200, a microprocessor 4400, and a user interface 4500. When the computing system 4000 is a mobile device, a battery 4600 for supplying an operation voltage of the computing system 4000 may be additionally provided. The computing system 4000 may include an application chip set (not shown), a camera image processor (CIS) (not shown), a mobile DRAM (not shown), and the like.

The semiconductor device 1000 may be configured in substantially the same manner as the semiconductor device 1000 in FIG. 1.

The memory controller 4100 and the semiconductor device 1000 may be components of a Solid State Drive/Disk (SSD).

The semiconductor device 1000 and the memory controller 4100 may be mounted using various types of packages. For example, the semiconductor device 1000 and the memory controller 4100 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

As described above, in embodiments of the semiconductor device and the programming method thereof, by programming the selected memory cell while dispersing a portion of the charge trapped in the selected memory cell in a direction of the adjacent cells, retention characteristics of the semiconductor device may be improved. As a result, reliability of the semiconductor device may be improved.

While certain embodiments have been described above, it will be understood to those skilled in the art that the embodiments described are by way of example only. Accordingly, the semiconductor device and the programming method thereof described herein should not be limited based on the described embodiments. Rather, the semiconductor device and the programming method thereof described herein should only be limited in light of the claims that follow when taken in conjunction with the above description and accompanying drawings.

What is claimed is:

1. A semiconductor device comprising:
   a plurality of electrically coupled memory cells in a generally vertical configuration extending in a substantially perpendicular direction from a semiconductor substrate;
   a peripheral circuit configured to program the memory cells; and
   a control circuit configured to program a memory cell selected from the plurality of memory cells to trap charge in the selected memory cell, and to issue at least one command to the peripheral circuit to disperse the charge trapped in the selected memory cell in a direction of the memory cells adjacent to the selected memory cell, but not such that the charge is trapped in the adjacent memory cells.

2. The semiconductor device of claim 1, wherein the plurality of memory cells are formed along a charge storage film vertically extending from the semiconductor substrate.

3. The semiconductor device of claim 2, wherein the charge storage film surrounds a tunnel insulating film vertically extending from the semiconductor substrate, and
   the tunnel insulating film surrounds a vertical channel film vertically extending from the semiconductor substrate.

4. The semiconductor device of claim 1, wherein the control circuit is configured to set, as a single program loop, a section to program the selected memory cell, a charge dispersion section to disperse at least a portion of the charge trapped in the selected memory cell, and a verification section to determine whether a threshold voltage of the selected memory cell has reached a target level, and
   the control circuit issues at least one command to repeat the program loop until the selected memory cell passes a verification operation of the verification section.

5. The semiconductor device of claim 4, wherein the control circuit is configured to issue at least one command to the peripheral circuit to apply a programming voltage to a selected word line electrically coupled to the selected memory cell in the section to program the selected memory cell, to apply a first sub-voltage having a level relatively lower than the programming voltage to adjacent word lines of the selected word line in the charge dispersion section, and to apply a verification voltage to the selected word line in the verification section.

6. The semiconductor device of claim 5, wherein the control circuit is configured to issue at least one command to increase the programming voltage in a stepwise manner every time the program loop is repeated.

7. The semiconductor device of claim 5, wherein the control circuit is configured to issue at least one command to apply a second sub-voltage that is relatively lower than the first sub-voltage to the selected word line in the charge dispersion section when the first sub-voltage is applied to the adjacent word lines.

8. The semiconductor device of claim 7, wherein the first sub-voltage is set so that at least a portion of the trapped charge is dispersed between the memory cells adjacent to the selected memory cell.

9. A programming method of a semiconductor device, comprising:
   programming a selected memory cell so that charge is trapped in the selected memory cell;
   dispersing at least a portion of the charge trapped in the selected memory cell in a direction of memory cells adjacent to the selected memory cell, but not such that the dispersed charge is trapped in the memory cells adjacent to the selected memory cell; and
   verifying the selected memory cell.

10. The programming method of claim 9, wherein verifying the selected memory cell comprises:
    if the selected memory cell passes a verification operation, a programming operation of the selected memory cell is complete; and
    if the selected memory cell fails the verification operation, the programming of the selected memory cell, the dispersing of at least a portion of the charge, and the verifying of the selected memory cell are repeated, wherein a programming voltage for programming the selected memory cell is incrementally increased with each repetition until the selected memory cell passes the verification operation.

11. The programming method of claim 9, wherein, dispersing at least a portion of the charge trapped in the selected memory cell comprises dispersing at least a portion of the trapped charge between the memory cells adjacent to the selected memory cell.

12. A programming method of a semiconductor device, comprising:
    programming a selected memory cell by applying a programming voltage to a selected word line electrically coupled to the selected memory cell so that charge is trapped in the selected memory cell;
    dispersing at least a portion of the charge trapped in the selected memory cell between memory cells adjacent to the selected memory cell by applying a first sub-voltage to adjacent word lines electrically coupled to the adjacent memory cells, but not such that the dispersed charge is trapped in the memory cells adjacent to the selected memory cell;
    verifying the selected memory cell by applying a verification voltage to the selected word line; and
    repeating the programming of the selected memory cell, the dispersing of at least a portion of the charge, and the verifying of the selected memory cell until the selected memory cell passes a verification operation associated with verifying the selected memory cell.

13. The programming method of claim 12, wherein programming of the selected memory cell comprises:
   applying a pass voltage to the selected word line, the adjacent word lines, and remaining unselected word lines; and
   applying the programming voltage to the selected word line.

14. The programming method of claim 12, wherein the first sub-voltage is set to be relatively lower than the programming voltage.

15. The programming method of claim 14, wherein dispersing at least a portion of the charge comprises applying a second sub-voltage that is relatively lower than the first sub-voltage to the selected word line when the first sub-voltage is applied to the adjacent word lines.

16. The programming method of claim 15, wherein the adjacent word lines include word lines coupled to memory cells adjacent to upper and lower portions of the selected memory cell, or a word line coupled to a memory cell whose programming operation has been completed, among the memory cells adjacent to the selected memory cell.

17. The programming method of claim 15, wherein the second sub-voltage is set to a level that is approximately 4 V to approximately 6 V lower than the first sub-voltage.

18. The programming method of claim 17, wherein the first sub-voltage is set in a range of approximately 0 V to approximately 12 V, and
   the second sub-voltage is set in a range of approximately −4 V to approximately 8 V.

19. The programming method of claim 12, the programming of the selected memory cell comprises trapping the charge in a charge storage film of the selected memory cell.

20. The programming method of claim 19, wherein dispersing at least a portion of the charge comprises dispersing at least a portion of the charge through a charge storage film extending in a direction of the adjacent memory cells from the selected memory cell.

* * * * *